(12) United States Patent
Kang

(10) Patent No.: US 8,622,579 B2
(45) Date of Patent: Jan. 7, 2014

(54) ILLUMINATION SYSTEM

(75) Inventor: Hyun-Gu Kang, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 228 days.

(21) Appl. No.: 13/315,824

(22) Filed: Dec. 9, 2011

(65) Prior Publication Data

US 2012/0074849 A1    Mar. 29, 2012

Related U.S. Application Data

(63) Continuation-in-part of application No. 12/703,279, filed on Feb. 10, 2010, now Pat. No. 8,192,068.

(30) Foreign Application Priority Data

Jun. 29, 2009    (KR) .................. 10-2009-0058584

(51) Int. Cl.
*F21V 33/00* (2006.01)
*H05B 37/03* (2006.01)

(52) U.S. Cl.
USPC ..................... 362/253; 362/234; 315/136

(58) Field of Classification Search
USPC .......... 362/234, 253, 276, 458; 315/136, 308, 315/312, 316, 324
See application file for complete search history.

(56) References Cited

U.S. PATENT DOCUMENTS

| 4,547,840 | A | 10/1985 | Tinder | |
|---|---|---|---|---|
| 6,107,941 | A * | 8/2000 | Jones | 340/915 |
| 6,582,100 | B1 | 6/2003 | Hochstein et al. | |
| 7,137,852 | B2 | 11/2006 | Tsukamoto | |
| 7,186,003 | B2 * | 3/2007 | Dowling et al. | 362/234 |
| 7,462,997 | B2 * | 12/2008 | Mueller et al. | 315/312 |
| 7,550,931 | B2 * | 6/2009 | Lys et al. | 315/291 |
| 7,598,686 | B2 * | 10/2009 | Lys et al. | 315/312 |
| 7,766,661 | B2 | 8/2010 | Kuwahara et al. | |
| 7,972,037 | B2 | 7/2011 | Anderson | |
| 8,192,068 | B2 * | 6/2012 | Kwon et al. | 362/646 |
| 2004/0105264 | A1 * | 6/2004 | Spero | 362/276 |
| 2005/0194607 | A1 | 9/2005 | Barnett et al. | |
| 2005/0276053 | A1 * | 12/2005 | Nortrup et al. | 362/234 |
| 2006/0018508 | A1 * | 1/2006 | Monk et al. | 382/100 |
| 2006/0082315 | A1 | 4/2006 | Chan | |

(Continued)

OTHER PUBLICATIONS

Non-Final Office Action of U.S. Appl. No. 12/703,279 dated Nov. 25, 2011.

(Continued)

*Primary Examiner* — Bao Q Truong
(74) *Attorney, Agent, or Firm* — H.C. Park & Associates, PLC

(57) ABSTRACT

An illumination system according to an exemplary embodiment of the present invention includes at least one light emitting apparatus including at least one light emitting module detachably coupled to the at least one light emitting apparatus, the at least one light emitting module including an information storage unit to store characteristic information of the at least one light emitting module. The at least one light emitting apparatus also includes a controller configured to detect whether the at least one light emitting module is connected to or disconnected from the at least one light emitting apparatus, and to read out the characteristic information of the at least one light emitting module according to a detection result, wherein the characteristic information includes unique identification information or absolute lifetime information of the at least one light emitting module.

19 Claims, 11 Drawing Sheets

(56) References Cited

U.S. PATENT DOCUMENTS

2007/0195526 A1* 8/2007 Dowling et al. ............. 362/234
2009/0073701 A1   3/2009 Lo
2009/0180689 A1* 7/2009 Komiya et al. ............. 382/167

OTHER PUBLICATIONS

Notice of Allowance of U.S. Appl. No. 12/703,279 dated Feb. 29, 2012.

* cited by examiner

US 8,622,579 B2

ILLUMINATION SYSTEM

CROSS-REFERENCE TO RELATED APPLICATIONS

This application is a Continuation-in-Part of U.S. patent application Ser. No. 12/703,279, filed on Feb. 10, 2010, and claims priority from and the benefit of Korean Patent Application No. 10-2009-0058584, filed on Jun. 29, 2009, which are both hereby incorporated by reference for all purposes as if fully set forth herein.

BACKGROUND OF THE INVENTION

1. Field of the Invention

Exemplary embodiments of the present invention relate to automatically displaying residual lifetime information or replacement information of a light emitting device. Specifically, exemplary embodiments of the present invention relate to preventing sudden failure in illumination due to deterioration of the light emitting device by informing a manager of is replacement information before termination of the lifetime of the light emitting device.

2. Discussion of the Background

In general, a light-emitting module includes a plurality of light-emitting packages and a plurality of printed circuit boards (PCBs). Each of the light-emitting packages includes a light-emitting chip having a light emitting diode and a housing to receive the light-emitting chip. The PCB includes a power-supplying pad to transfer external electrical power. The light-emitting package receives electrical power through a lead frame that is electrically connected to the power-supplying pad. Typically, the lead frame of the light-emitting package is soldered to the power-supplying pad of the PCB.

When one of the light-emitting packages is faulty, it should be replaced. However, it may be complicated to replace a light-emitting package because the typical process includes de-soldering the lead frame from the power-supplying pad. As a result, the entire light-emitting module having a faulty light-emitting package is often replaced.

SUMMARY OF THE INVENTION

Exemplary embodiments of the present invention provide a light-emitting module having a light-emitting package that may be easily combined with and also easily detached from a printed circuit board so that the light-emitting package may be replaced as desired, for is example, when the light-emitting package fails.

Additional features of the invention will be set forth in the description which follows, and in part will be apparent from the description, or may be learned by practice of the invention.

An exemplary embodiment of the present invention discloses an illumination system having at least one light emitting apparatus having at least one light emitting module detachably coupled to the at least one light emitting apparatus, the at least one light emitting module having an information storage unit to store characteristic information of the at least one light emitting module, and a controller configured to detect whether the at least one light emitting module is connected to or disconnected from the at least one light emitting apparatus, and to read out the characteristic information of the at least one light emitting module according to a detection result, wherein the characteristic information comprises unique identification information or absolute lifetime information of the at least one light emitting module.

BRIEF DESCRIPTION OF THE DRAWINGS

The accompanying drawings, which are included to provide a further understanding of the invention and are incorporated in and constitute part of this specification, illustrate exemplary embodiments of the invention, and together with the description serve to explain the principles of the invention.

DETAILED DESCRIPTION OF THE ILLUSTRATED EMBODIMENTS

Figure 1:
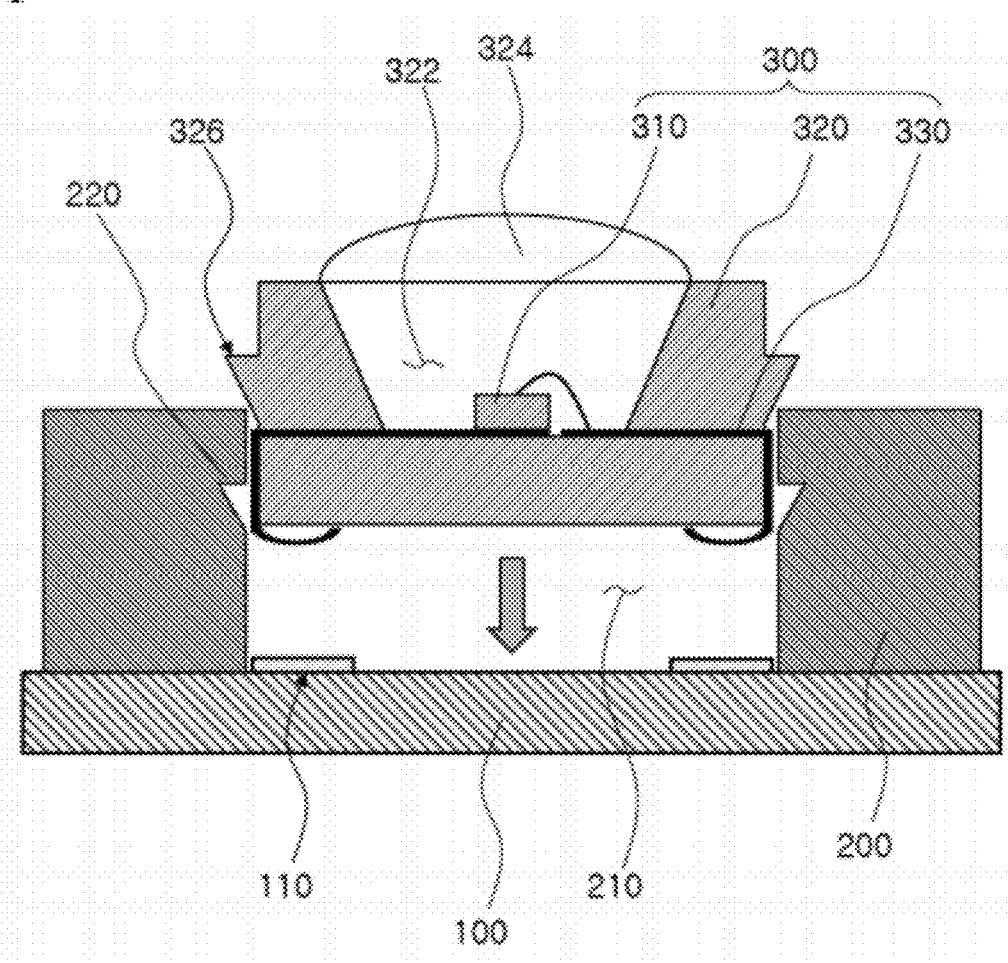
FIG. 1 is a cross-sectional view of a light-emitting module according to an exemplary embodiment of the present invention before a light emitting-chip is fastened to a printed circuit board.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

It will be understood that, although terms such as first, second, and third may be used to describe various items such as elements, components, regions, layers, or sections, these items are not be limited by these terms. These terms are only used to distinguish one item from another item. Thus, a first element, component, region, layer, or section could be termed a second element, component, region, layer, or section without departing from the teachings of the present invention.

Spatially relative terms such as "beneath," "below," "lower," "above," and "upper" may be used for ease of description to describe how an element or feature is related to another element or feature as illustrated in the figures. It will be understood that spatially relative terms are intended to encompass different orientations of the device in use or in operation in addition to the orientation depicted in the figures. For example, if a device shown in a figure is rotated, elements described as "below" or "beneath" other elements or features might then be oriented "above" the other elements or features. Thus, the exemplary term "below" encompasses both orientations of "above" and "below." The device may be otherwise oriented (rotated 90 degrees or at other orientations), and the spatially relative descriptors used herein interpreted accordingly.

Hereinafter, exemplary embodiments of the present invention are described in detail with reference to the accompanying drawings.

Figure 2:
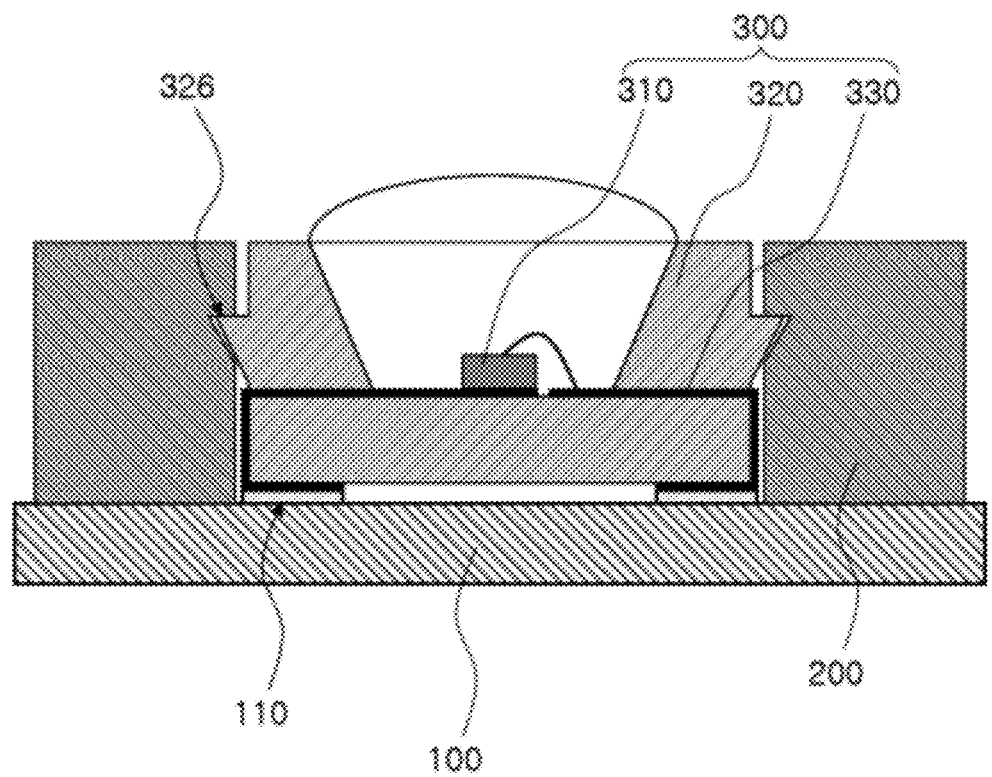
FIG. 2 is a cross-sectional view showing the light-emitting module of FIG. 1 after the light emitting-chip is fastened to the printed circuit board.

FIG. 1 is a cross-sectional view of a light-emitting module according to an exemplary embodiment of the present invention before a light emitting-chip is fastened to a printed circuit board, and FIG. 2 is a cross-sectional view showing the light-emitting module of FIG. 1 after the light emitting-chip is fastened to the printed circuit board.

Referring to FIG. 1 and FIG. 2, a light-emitting module includes a printed circuit board (PCB) 100, a fastening member 200, and a light-emitting package 300. The PCB 100 includes a power-supplying pad 110 to transfer an external driving power to the light-emitting package 300.

The power-supplying pad 110 is formed on the PCB 100 and may have two pads spaced apart from each other to apply opposite polarity voltages to the light-emitting package 300. Additionally, the PCB 100 includes a plurality of wirings (not shown) to transfer the external power to the power-supplying pad 110. The plurality of wirings may be formed on an upper surface of the PCB 100 or a lower surface of the PCB 100.

The fastening member 200 is disposed on the PCB 100 and has a package-receiving hole 210 exposing the power-supplying pad 110. The fastening member 200 may include an elastic material to detachably fasten the light-emitting package 300. For example, the fastening member 200 may include elastic materials such as rubber, silicone, or compositions thereof. However, the fastening member 200 may include relatively hard materials such as a plastic. The fastening member 200 may be disposed on the PCB 100 such that the fastening member 200 is detachably combined with the PCB 100. Alternatively, the fastening member 200 may be integrally formed with the PCB 100.

When the PCB 100 includes the wirings formed thereon, the fastening member 200 may make contact with the wirings. Therefore, electrically insulating material may be disposed between the fastening member 200 and the wirings. The fastening member 200 may have a rectangular shape as shown in FIG. 1 and FIG. 2. Alternatively, the fastening member 200 may have other polygonal shapes. The fastening member 200 may have a catching jaw 220 formed on an inner surface of the fastening member 200. Preferably, two catching jaws 220 may be formed to face each other.

The light-emitting package 300 is received by (or inserted into) the package-receiving hole 210 to combine with the fastening member 200 and electrically connect to the power-supplying pad 110 on the PCB 100. The light-emitting package 300 is detachably coupled with the fastening member 200. In other words, the light-emitting package 300 may be easily detached from the fastening member 200 so that the light-emitting package 300 may be easily replaced as desired.

Since the fastening member 200 may include elastic material, a user may compress the peripheral regions of the fastening member 200 to increase the width of the package-receiving hole 210 so that the light-emitting package 300 may be easily extracted from the package-receiving hole 210.

The light-emitting package 300 includes a light-emitting chip 310, a housing 320, and a lead frame 330. The light-emitting chip 310 includes a semiconductor material, for example, gallium nitride or indium nitride. The light-emitting chip 310 may generate light of various wavelengths such as red light, green light, blue light, ultraviolet light, or white light.

The housing 320 receives the light-emitting chip 310. The housing 320 may include, for example, polyphthalamide resin and may be formed through a molding method. The housing 320 may include electrically or thermally insulating material.

In exemplary embodiments of the present invention, the housing 320 has an opening portion 322 exposing at least a portion of the light-emitting chip 310. The opening portion 322 may have various shapes such as a circular shape, an oval shape, or polygonal shape.

The inner surface of the housing 320 corresponding to the opening portion 322 may be angled with respect to the PCB 100 increasing the solid angle subtended by light generated by the light-emitting chip 310.

The opening portion 322 may be filled with an encapsulant covering the light-emitting chip 310. The encapsulant may be optically transparent to efficiently transmit light generated by the light-emitting chip 310. Additionally, a lens 324 may be disposed on the housing 320.

The housing 320 include a fastening protrusion 326 formed on an outer surface of the housing 320. The outer surface of the housing faces the inner surface of the fastening member 200. When the light-emitting package 300 is inserted into the package-receiving hole 210, the fastening protrusion 326 is combined with the catching jaw 220 so that the light-emitting package 300 is fastened to the PCB 100 through the fastening member 200. Two fastening protrusions 326 may be formed to correspond to the two catching jaws 220.

The fastening protrusion 326 may have a triangular shape as shown in FIG. 1 and FIG. 2. Alternatively, the fastening protrusion 326 may have various shapes such as a semicircular shape or polygonal shape. In this embodiment, the fastening protrusion 326 has a triangular shape with increasing width along a direction from a lower portion of the housing 320 to the upper portion of the housing 320. For example, the fastening protrusion 326 has a right triangular shape as shown in FIG. 1 and FIG. 2.

As a result, when the light-emitting package 300 is inserted into the package-receiving hole 210, the fastening protrusion 326 is caught by the catching jaw 220 so that the light-emitting package 300 is stably combined with the PCB 100 through the fastening member 200. Furthermore, the width of the fastening protrusion 326 increases along the direction from the lower portion of the housing 320 to the upper portion of the housing 320 so that upper portion of the fastening protrusion 326 is caught by the catching jaw 220 to prevent unwanted detachment of the light-emitting package 300 from the package-receiving hole 210.

The fastening protrusion 326 may be spaced apart from the lead frame 330 to prevent contact between the fastening protrusion 326 and the lead frame 330.

The lead frame 330 is electrically connected to the light-emitting chip 310 by a wire 340, and the lead frame 330 extends from inside the housing 320 to outside the housing 320 to be electrically connected to the power-supplying pad 110. In the present embodiment, the lead frame 330 includes two lead terminals 351 and 352 spaced apart from each other.

In order to electrically connect the light-emitting chip 310 to the lead frame 330, a portion of lead frame 330 on which the light-emitting chip 310 is mounted is exposed through the opening portion 322. Furthermore, the lead frame 330 extends out of the housing 320 to be electrically connected to the power-supplying pad 110 via the lead terminals 351 and 352. Voltages may be applied to the two lead terminals by contact with the power-supplying pads 110.

A portion of the lead frame 330, e.g., the lead terminal 351 and 352, is curved to provide elasticity and to contact with the power-supplying pad 110. When the light-emitting package 300 is inserted into the package-receiving hole 210, the portion of the lead frame 330 that is curved pushes against the power-supplying pad 110 so that the fastening protrusion 326 and the catching jaw 220 become engaged. Furthermore, when the light-emitting package 300 is inserted into the package-receiving hole 210, the portion of the lead frame 330, which is curved, ensures electrical connection between the power-supplying pad 110 and the lead frame 330.

As shown in FIG. 2, when the light-emitting package 300 is inserted into the package-receiving hole 210, the fastening protrusion 326 of the housing 320 may be caught by the catching jaw 220 of the fastening member 200.

Figure 3:
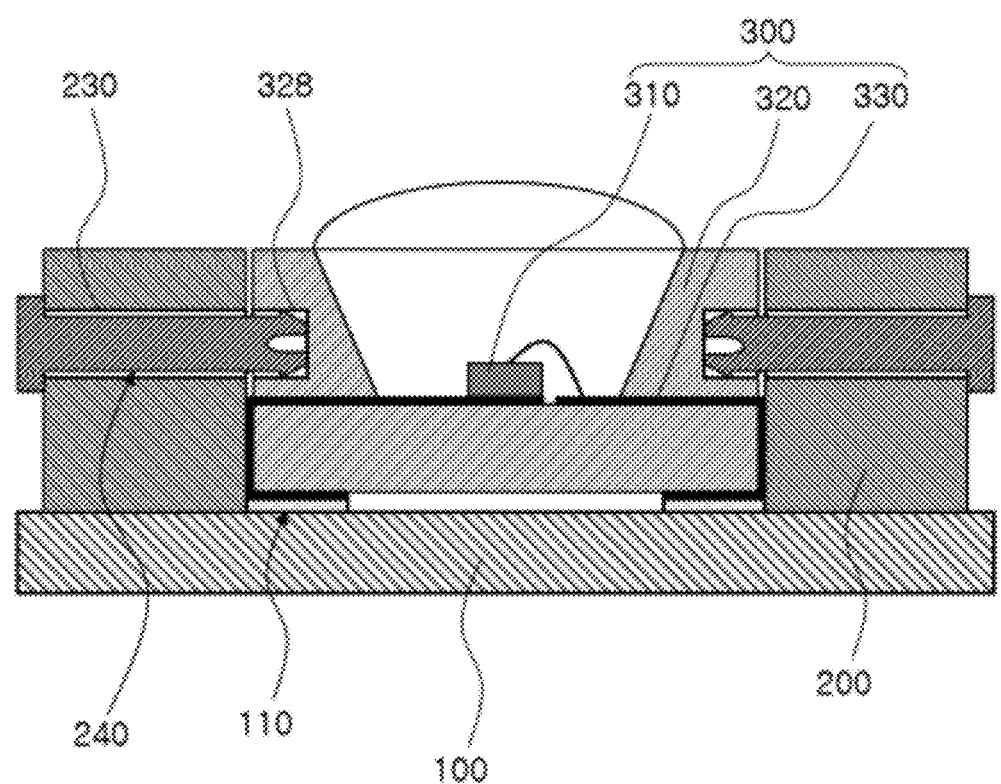
FIG. 3 is a cross-sectional view of a light-emitting module according to an exemplary embodiment of the present invention.

FIG. 3 is a cross-sectional view of a light-emitting module according to another exemplary embodiment of the present invention.

Referring to FIG. 3, the housing 320 includes a hollow portion 328. The housing 320 may include two hollow portions 328. The two hollow portions 328 may be formed at opposite sides of the housing 320. The hollow portion 328 is spaced apart from the lead frame 330 to prevent contact between the hollow portion 328 and the lead frame 330.

The fastening member 200 includes a penetration hole 230. The penetration hole 230 is formed at a region corresponding to the hollow portion 328. The fastening member 200 also includes an insertion unit 240. The insertion unit 240 penetrates the penetration hole 230 to be inserted into the hollow portion 328 to fasten the light-emitting package 300 to the PCB 100.

The insertion unit 240 has a cross-sectional area that is similar to that of the penetration hole 230 to prevent foreign substances from entering the package-receiving hole 210 so that the light-emitting efficiency of the light-emitting package 300 is not diminished. The insertion unit 240 may include an elastic material so that the insertion unit 240 may easily penetrate the penetration hole 238 and easily insert into the hollow portion 328.

A first end portion of the insertion unit 240, which is inserted into the hollow portion 328, may be formed to have a hook-shape as shown in FIG. 3. Therefore, the insertion unit 240 is not easily separated from the hollow portion 328 of the housing 320 to stabilize the connection between the light-emitting package 300 and the PCB 100. A second end portion of the insertion unit 240, which is opposite to the first end portion, has a larger radius than a center portion of the insertion unit 240 so that the insertion unit 240 has a nail head shape. Therefore, the insertion unit 240 may be easily extracted from the hollow portion 328 when detaching the light-emitting package 300 from the PCB 100, for example, when the light-emitting package 300 fails. Although not shown in FIG. 3, a portion of the insertion unit 240 between the first and second end portions may have a larger radius than the end portions so that the insertion unit 240 may be tightly combined with the fastening member 200.

Although not shown in FIG. 3, a first end portion of the insertion unit 240, which is inserted into the hollow portion 328, may be bent, and the hollow portion 328 may have a keyway shape that accommodates rotation of the first end portion of the insertion unit 240 within the hollow portion 328. When the first end portion of the insertion unit 240 is inserted into the hollow portion 328, the insertion unit 240 may be rotated and locked into the hollow portion 328 to securely fasten the light-emitting package 300 to the PCB 100.

Alternatively, the two insertion units 240 may have different shapes relative to each other. For example, one of the two insertion units 240 may have a hook-shaped end portion as described above, and the first end portion of the other insertion unit 240 may have a cross-sectional area similar to that of the hollow portion 328 to prevent the insertion unit 240 from being disengaged from the penetration hole 230 and the hollow portion 328. Therefore, the light-emitting package 300 may be stably combined with the PCB 100.

The fastening member 200 may be integrally formed with the PCB 100. Alternatively, the fastening member 200 may be formed separately from the PCB 100 so that the fastening member 200 may be detachably combined with the PCB 100.

Figure 4:
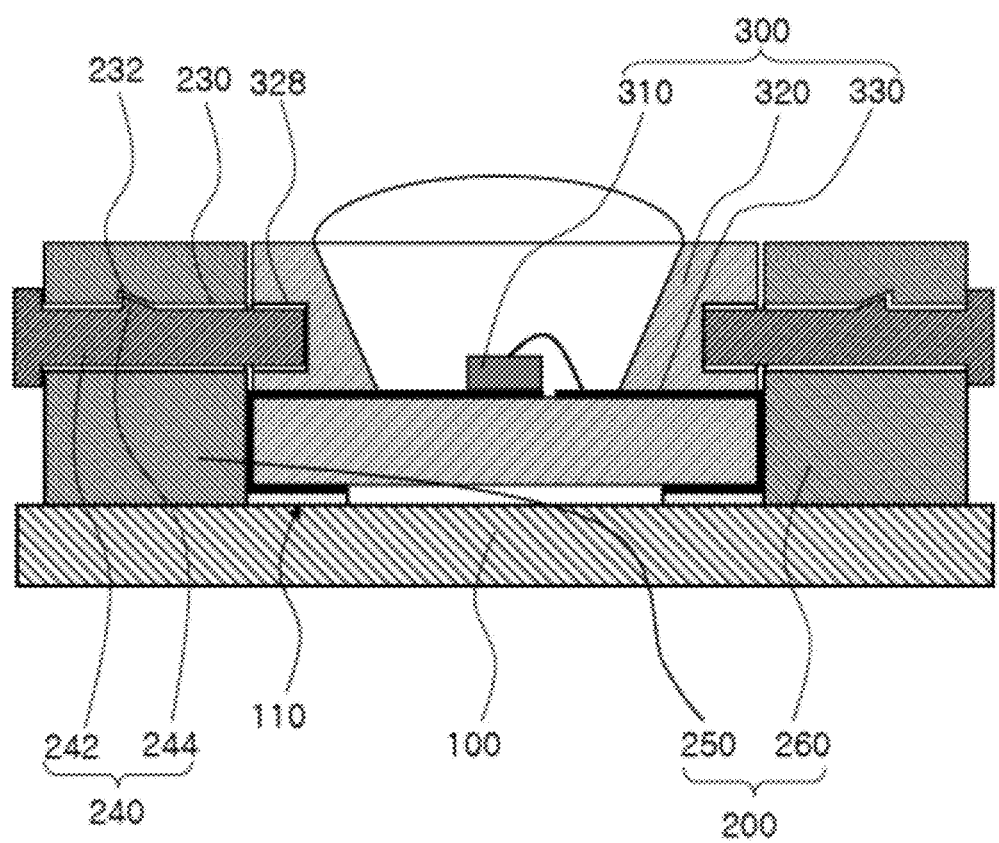
FIG. 4 is a cross-sectional view of a light-emitting module according to an exemplary embodiment of the present invention.

FIG. 4 is a cross-sectional view of a light-emitting module according to another exemplary embodiment of the present invention.

Referring to FIG. 4, a light-emitting module includes a PCB 100, a fastening member 200, and a light-emitting package 300. The PCB 100 has a power-supplying pad 110 to apply electrical power to the light-emitting package 300. The fastening member 200 includes a first fastening part 250 and a second fastening part 260 spaced apart from each other such that the power-supplying pad 110 on the PCB 100 is disposed between the first fastening part 250 and the second fastening part 260.

The first fastening part 250 and the second fastening part 260 are spaced apart on the PCB 100 to define a package-receiving space to receive the light-emitting package 300. The package-receiving space may have various shapes such as a rectangular shape or a semicircular shape.

The first fastening part 250 and the second fastening part 260 may be detachably combined with the PCB 100. Alternatively, the first fastening part 250 and the second fastening part 260 may be integrally formed with the PCB 100.

The light-emitting package 300 is inserted into the package-receiving space between the first fastening part 250 and the second fastening part 260 to be detachably combined with the PCB 100 so that the light-emitting package 300 is electrically connected to the power-supplying pad 110.

The fastening member 200 includes a penetration hole 230 at a position corresponding to the hollow portion 328. The fastening member 200 may further include an insertion unit 240 to pass through the penetration hole 230 and to insert into the hollow portion 328 so that the light-emitting package 300 is fastened to the PCB 100.

The insertion unit 240 includes an insertion body 242 and a protrusion 244. The insertion body 242 penetrates the penetration hole 230 and inserts into the hollow portion 328. The insertion body 242 has a cross-sectional shape similar to that of the penetration hole 230 to prevent foreign substances from entering the package-receiving space.

The protrusion 244 protrudes from the insertion body 242 and inserts into a catching recess 232 formed on an inner surface of the penetration hole 230. More than one catching recess 232 may be formed on the inner surface of the penetration hole 230.

The width of the protrusion 244 decreases along the direction from outside the fastening member 200 to the housing 320. For example, the protrusion 244 has a right triangular cross-section whose hypotenuse forms an acute included angle with the insertion unit 240.

Therefore, when the insertion unit 240 is extracted from the hollow portion 328, the protrusion 244 is caught by the catching recess 232 to prevent the insertion unit 240 from being pulled completely out of the penetration hole 230.

In contrast, when the insertion unit 240 is pulled out of the hollow portion 328 in order to replace the light-emitting package 300, the insertion unit 240 may be pushed and rotated. When the protrusion 244 disengages from the catching recess 232, the insertion unit 240 may be easily pulled out of the penetration hole 230. Then, the light-emitting package 300 may be easily detached from the package-receiving space.

According to exemplary embodiments of the present invention, the light-emitting package 300 is received by the package-receiving hole 210 so that the light-emitting package 300 may be easily combined with the PCB 100. Additionally, the light-emitting package 300 may be replaced when the light-emitting package 300 does not operate as desired.

Furthermore, a portion of the lead frame 330 may be curved to introduce elasticity to the lead frame 330 so that the lead frame 330 may easily electrically contact the power-supplying pad. Therefore, when the light-emitting package 300 is inserted into the package-receiving hole 210, the portion of the lead frame 330, which is curved, pushes against power-supplying pads 110 so that the fastening protrusion 326 and the catching jaw 220 become engaged.

Furthermore, the fastening member 200 includes the insertion unit 240 to penetrate the penetration hole 230 and to insert into the hollow portion 328 so that the light-emitting package 300 may be stably fastened to the PCB 100.

Figure 5:
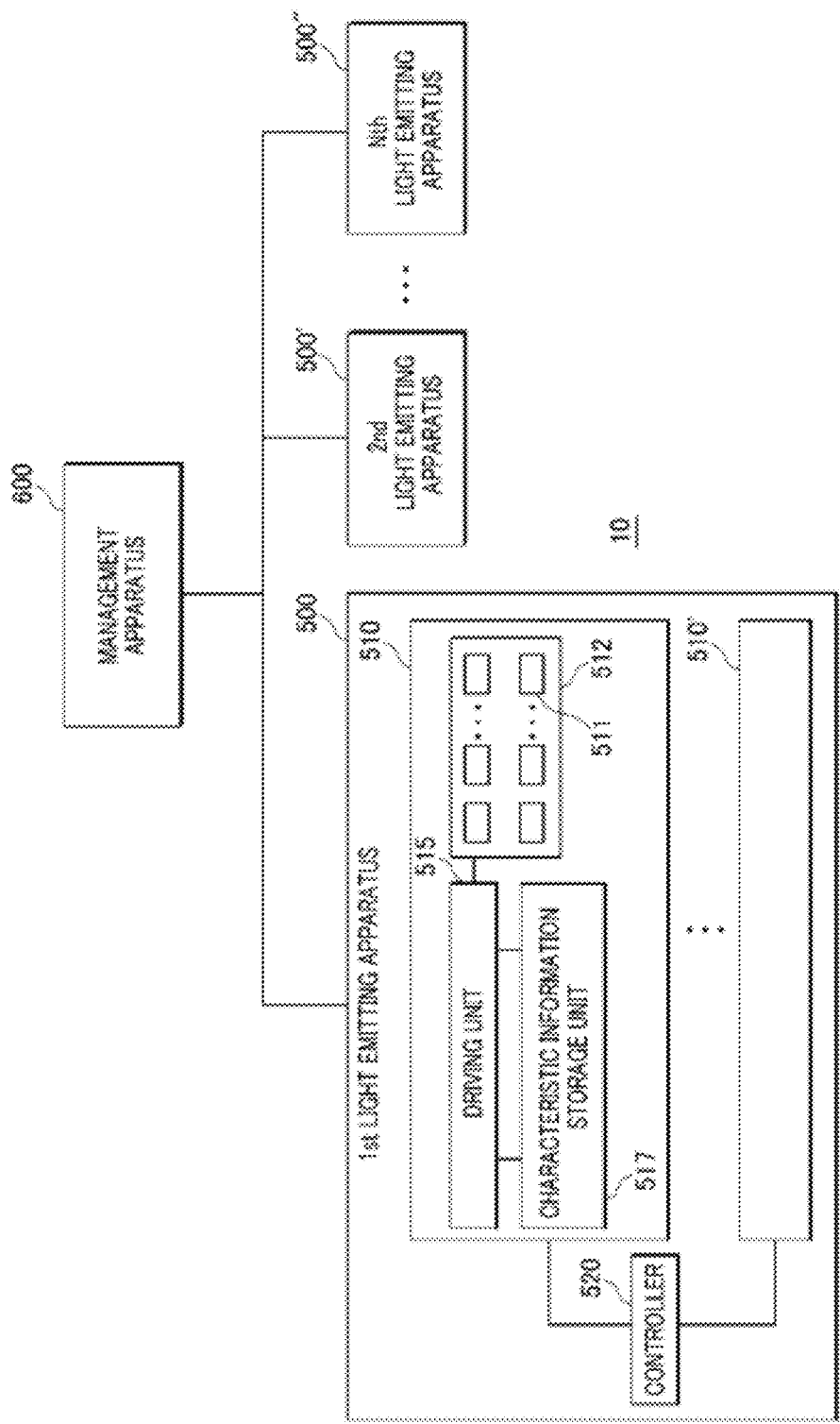
FIG. 5 is a diagram illustrating an illumination system according to an exemplary embodiment of the present invention.
Figure 6:
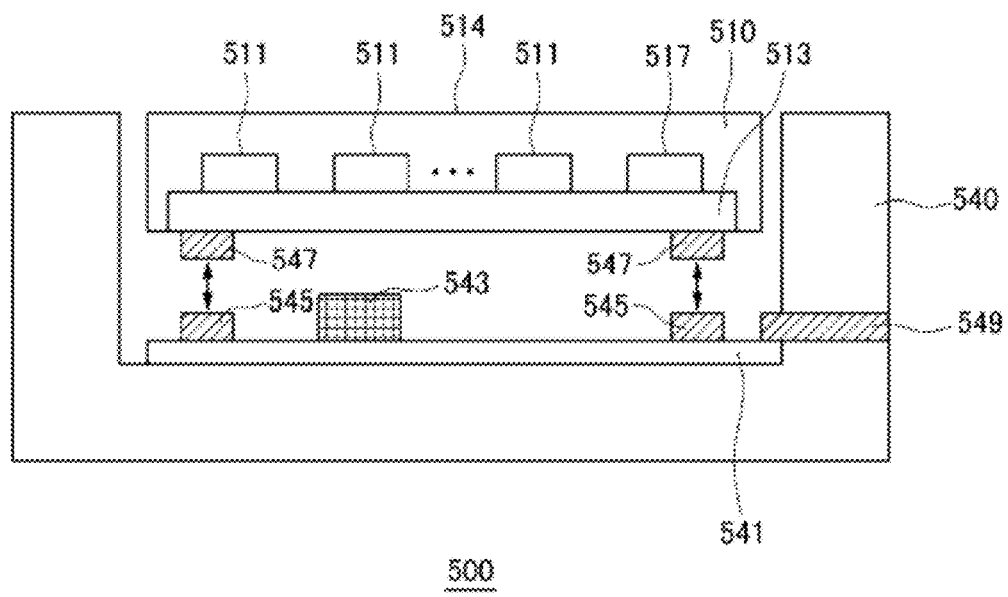
FIG. 6 is a diagram showing a configuration of a light emitting apparatus combined with the illumination system according to an exemplary embodiment of the present invention.

FIG. 5 is a diagram illustrating an illumination system in accordance with an exemplary embodiment of the present invention. FIG. 6 is a diagram illustrating a configuration of a light emitting apparatus coupled to the illumination system in accordance with the present exemplary embodiment.

An illumination system 10 may include one or more light emitting apparatuses 500, 500', and 500", and a management apparatus 600 for managing each light emitting apparatus 500, 500', and 500".

Each light emitting apparatus 500 may include one or more light emitting modules 510 and 510' and a controller 520. Each of the light emitting modules 510 and 510' may be connected to or disconnected from the light emitting apparatus 500 depending on a user's selection. When the light emitting modules 510 and 510' are connected to the single light emitting apparatus 500, a multiple number of sockets (not shown) for connecting the light emitting modules 510 and 510' may be further included as a coupling member.

Referring to FIG. 6, a detailed configuration of the light emitting apparatus 500 will be explained. The light emitting module 510 may be physically and electrically connected with a case 540 of the light emitting apparatus 500.

The light emitting module 510 may include one or more light emitting packages 511 physically and electrically connected with a circuit board 513, a housing 514, a driving unit 515, and a characteristic information storage unit 517. Here, the light emitting package 511 may correspond to the light emitting package 300 as described with reference to FIGS. 1 to 4. Further, a fastening member (not shown) for fastening the light emitting package 511 to the light emitting module 510 may be further included. Meanwhile, a light emitting portion 512 may include a plurality of light emitting packages 511.

Further, the light emitting module 510 includes the driving unit 515 for controlling an operation of the light emitting portion 512 or the light emitting package 511. The driving unit 515 may supply driving voltages to the light emitting portion 512 or the light emitting package 511 and control a driving state of the light emitting module 510 in response to a driving control signal controlled by the user or the management apparatus 600. For example, the driving unit 515 may control a driving state of the light emitting module 510 based on, for example, a turn-on/turn-off control signal or a dimming control signal for the light emitting module 510 inputted by the user through a switching controller (not shown) or the like.

The characteristic information storage unit 517 may store characteristic information of the light emitting module 510. For example, the characteristic information storage unit 517 may store unique identification information or absolute lifetime information of the light emitting module 510. Further, depending on a storage capacity of the characteristic information storage unit 517, the characteristic information storage unit 517 may further include Internet-based or website information such as a URL of a server capable of providing minimum identification information related to the light emitting module 510 and characteristic information of the light emitting module 510.

The characteristic information storage unit 517 may be implemented by a fuse circuit capable of storing information therein, a non-volatile memory device such as a flash memory, a radio-frequency identification (RFID) circuit, or the like.

A characteristic information storage unit 517 may be coupled to each of the light emitting packages 511. That is, replacement of components may be performed on the unit of a light emitting package 511. Characteristic information storage units 517 may be coupled to the light emitting packages 511 individually so as to generate replacement information for each light emitting package 511. Further, a plurality of sensors (not shown) for detecting connection/disconnection of the light emitting packages 511 may be respectively coupled to the light emitting packages 511.

The housing 514 accommodates therein the components of the light emitting modules 510. That is, the housing 514 accommodates the light emitting package 511, the light emitting portion 512, the circuit board 513, the driving unit 515, and the characteristic information storage unit 517.

The case 540 accommodates the aforementioned components of the light emitting apparatus 500. The light emitting module 510 can be connected to or disconnected from the light emitting apparatus 500 through an open area of the case 540. Light emitted from the light emitting module 510 may be released to the outside through the open area or a transmission area of the case 540.

The circuit board 541 may supply a driving power or various control signals to the light emitting module 510. The driving power or the control signals may be transmitted to the light emitting module 510 via electrode pads 545 of the circuit board 541 and electrode pads 547 of the light emitting module 510.

A sensor 543 may serve to detect connection/disconnection of the light emitting module 510 to or from the case 540 or the circuit board 541 of the light emitting apparatus 500 and generate sensing information. For example, the sensor 543 may be a pressure sensor capable of sensing an external pressure applied to the housing or the circuit board 513 of the light emitting module 510. Further, the sensor 543 may be an analog circuit for detecting a variation in an electric signal and is capable of detecting a variation in an electric signal flowing in a circuit in the vicinity of the electrode pads 545 depending on connection or disconnection between the electrode pads 547 of the light emitting module 510 and the electrode pads 545 of the circuit board 541. The various sensing information detected by the sensor 543 may be transmitted to the controller 520.

A connector 549 may connect a cable of the management apparatus 600 to the circuit board 541. The connector 549 may send the characteristic information of each light emitting module 510 read out by the controller 520 to the management apparatus 600. Further, the connector 549 may transmit the driving power and the control signals sent from the management apparatus 600 to the light emitting apparatus 500.

Now, a configuration and an operation of the controller 520 will be discussed in detail.

Figure 7:
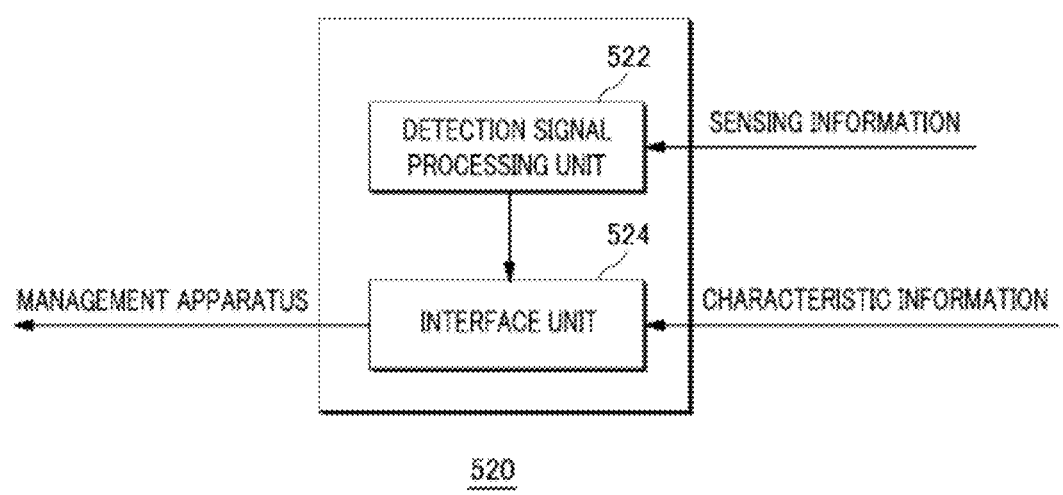
FIG. 7 is a diagram showing a configuration of a controller included in the illumination system according to an exemplary embodiment of the present invention.

FIG. 7 is a diagram illustrating the configuration of the controller 520 included in the illumination system in accordance with an exemplary embodiment of the present invention.

The controller 520 may include a detection signal processing unit 522 and an interface unit 524.

The detection signal processing unit 522 may generate, based on the various sensing information detected by the sensor 543, a connection detection signal indicating that the light emitting module 510 is connected to the light emitting apparatus 500 or generate a disconnection detection signal indicating that the light emitting module 510 is disconnected from the light emitting apparatus 500. For example, if a pressure detected by the sensor 543 exceeds a reference value, a connection detection signal indicating the connection of the light emitting module 510 may be generated. Further, if a current detected by the sensor 543 exceeds a reference value, a connection detection signal indicating the connection of the light emitting module 510 may also be generated. Meanwhile, if the pressure or the current detected by the sensor 543 is below the reference value, a disconnection detection signal indicating the disconnection of the light emitting module 510 may be generated. The connection detection signal or the disconnection detection signal may be sent to the interface unit 524.

When the connection detection signal is received from the detection signal processing unit 522, the interface unit 524 may read out the characteristic information of the light emitting module 510 from the characteristic information storage unit 517 and send this characteristic information to the management apparatus 600. Meanwhile, when the disconnection detection signal is received from the detection signal processing unit 522, the interface unit 524 may send to the management apparatus 600 the disconnection detection signal indicating that the light emitting module 510 is disconnected.

Alternatively, the interface unit 524 may send the connection detection signal generated by the detection signal processing unit 522 to the management apparatus 600. Then, if the management apparatus 600 sends a request for transmission of the characteristic information in response to the connection detection signal, the interface unit 524 may read out and send the characteristic information of the light emitting module 510 to the management apparatus 600.

The interface unit 524 may read out the various information in different ways depending on a configuration of the characteristic information storage unit 517. By way of example, if the characteristic information storage unit 517 is a nonvolatile memory device such as a flash memory, the interface unit 524 may apply a read-out voltage and read out information stored in the nonvolatile memory device. Further, if the characteristic information storage unit 517 is a RFID tag, the interface unit 524 may read out information stored in the RFID tag by using a wireless frequency.

Meanwhile, in case that the light emitting modules 510 and 510' are connected to the light emitting apparatus 500, the interface unit 524 may read out characteristic information of the light emitting modules 510 and 510' individually and transmit the read-out characteristic information. Further, if the characteristic information storage unit 517 stores only the absolute lifetime information of the light emitting module 510, the interface unit 524 may send to the management apparatus 600 the absolute lifetime information of the light emitting module 510 while adding thereto an identifier previously set for the light emitting module 510.

Referring back to FIG. 5, the management apparatus 600 receives the characteristic information of the light emitting module 510 from the light emitting apparatus 500. The management apparatus 600 may manage the received data by matching the received characteristic information with an identification number of the light emitting apparatus 500 from which the corresponding characteristic information is outputted.

The management apparatus 600 may perform a driving control of each light emitting apparatus 500 based on a driving control signal for each light emitting apparatus 500. For example, when a control signal for stopping or starting the driving of the light emitting apparatus 500 is received according to the selection of the manager of the management apparatus 600, the management apparatus 600 may perform a control operation for stopping a power supply to the light emitting apparatus 500 or restarting a ceased power supply in response to the received control signal.

The management apparatus 600 may calculate a residual lifetime of the light emitting module 510 based on the characteristic information of the light emitting module 510 connected to the light emitting apparatus 500 and display replacement information to the user based on the calculated residual lifetime information.

Figure 8:
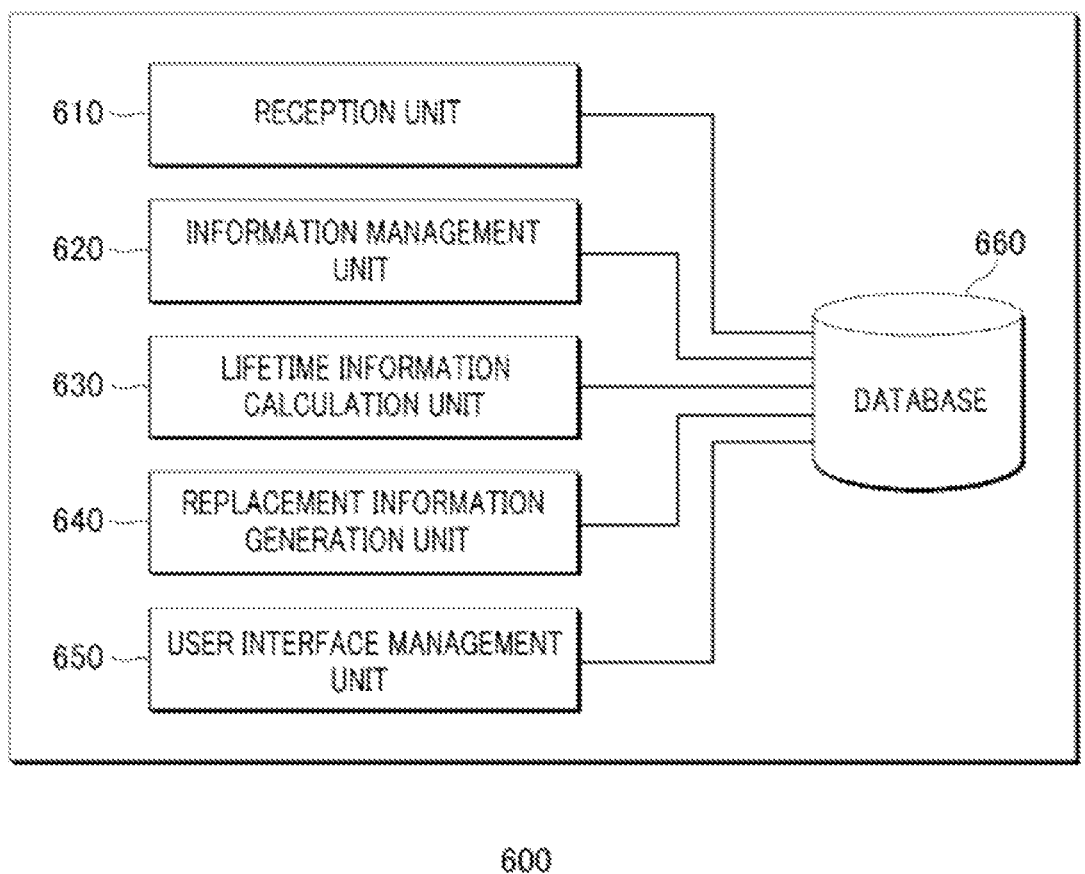
FIG. 8 is a diagram showing a configuration of a management apparatus included in the illumination system according to an exemplary embodiment of the present invention.

FIG. 8 is a diagram illustrating a detailed configuration of the management apparatus 600 included in the illumination system in accordance with the present exemplary embodiment.

The management apparatus 600 may include a reception unit 610, an information management unit 620, a lifetime information calculation unit 630, a replacement information generation unit 640, a user interface management unit 650, and a database 660. Each of the components illustrated in FIG. 8 in accordance with the present exemplary embodiment may imply software or hardware such as a field programmable gate array (FPGA) or an application specific integrated circuit (ASIC), and may carry out a predetermined function.

The components in the management apparatus 600 are not limited to particular software or hardware, and each of the components may be stored in an addressable storage medium or may be configured to implement one or more processors.

Accordingly, the components in the management apparatus 600 may include, for example, software, object-oriented software, classes, tasks, processes, functions, attributes, procedures, sub-routines, segments of program codes, drivers, firmware, micro-codes, circuits, data, database, data structures, tables, arrays, variables and the like.

Further, the components and functions of the management apparatus 600 can be combined with each other or can be divided.

First, the reception unit 610 may receive the characteristic information of the light emitting module 510 connected to the management apparatus 600. As stated above, the characteristic information of the light emitting module 510 may include unique identification information or absolute lifetime information of the light emitting module or site information of a server for providing lifetime information. Such characteristic information of the light emitting module 510 may be sent to the reception unit 610 while being matched with the identification information of the light emitting apparatus 500 to which the light emitting module 510 is connected.

The reception unit 610 may classify the received characteristic information of the light emitting module 510 based on the identification information of the light emitting apparatus 500 and store the classified characteristic information in the database 660. Then, the reception unit 610 may inform the information management unit 620 that the characteristic information has been received.

Further, when the light emitting module 510 is connected to the light emitting apparatus 500, the reception unit 610 may receive not only the characteristic information but also read out information stored in the characteristic information storage unit 517 of the light emitting module 510 by directly accessing the light emitting module 510 in response to a request from the manager.

The information management unit 620 may store, in the database 660, the characteristic information of the light emitting module 510 received by the reception unit 610, information upon a time point when a connection detection signal is received, information upon a time point when a disconnection detection signal is received, and the like, while classifying that information for each light emitting apparatus 500. Furthermore, the information management unit 620 may also manage the residual lifetime information calculated by the lifetime information calculation unit 630, the replacement information generated by the replacement information generation unit 640, and the like, through the use of the database 660.

For example, the information management unit 620 may manage the unique identification information and the absolute lifetime information of the light emitting module 510, the URL information of the server capable of providing the characteristic information of the light emitting module 510, and the like, for each light emitting apparatus 500.

The lifetime information calculation unit 630 may calculate the residual lifetime of the light emitting module 510 based on the characteristic information of the light emitting module 510, and store the calculated residual lifetime in the database 660. For example, the residual time may be calculated by subtracting, from the absolute lifetime information recorded in the database 660, the time that has elapsed after the light emitting module 510 is connected to the light emitting apparatus 500.

The replacement information generation unit 640 may check the residual lifetime information of each light emitting module 510 that is stored in the database 660. If the checked residual lifetime is within a threshold value, the replacement information generation unit 640 may display replacement information of the corresponding light emitting module to the user.

For example, the information of the light emitting module 510, of which residual lifetime is within the threshold value may be displayed to the user with an alarm message through an output unit in the form of a display or through a user interface. Further, the residual lifetime information of each light emitting module 510 connected to the light emitting apparatus 500 and the information of the light emitting module 510 having the residual lifetime within the threshold value may be displayed together, thus allowing the user to check the residual lifetime information of each light emitting module 510 connected to the light emitting apparatus 500 and the information of the light emitting module 510 that needs to be replaced. If the user replaces the corresponding light emitting module 510 according to such an alarm message, characteristic information of the new light emitting module 510 may be acquired as described above and residual lifetime information thereof may be continuously managed through the database 660.

The user interface management unit 650 may manage the operation of the user interface that displays to the user status information of the light emitting module 510 connected to the light emitting apparatus 500. The user interface can display information indicating an operation status of each light emitting module 510 through the output unit in the form of a display. The user interface can display the unique identification information, the residual lifetime information, and the replacement information of each light emitting module 510 in a visible manner. Further, the user interface may also display information indicating which light emitting apparatus 500 the light emitting module 510 is connected to or position information indicating which position of the light emitting apparatus 500 the light emitting module 510 is connected.

The database 660 may store therein information upon each of the light emitting apparatuses 500, 500', and 500" and information upon each light emitting module 510 in advance. That is, position information of each of the light emitting apparatuses 500, 500', and 500", information indicating the number of light emitting modules 510 connectable to each light emitting apparatus, identification information of sockets for coupling the light emitting modules 510 to each light emitting apparatus, and the like may be stored in advance. Furthermore, the database 660 may store therein the absolute lifetime information corresponding to the identification information of each light emitting module 510 in advance. The characteristic information storage unit 517 is designed to have a minimum information storage capacity in consideration of an information storage cost for the light emitting module 510. For example, if the characteristic information storage unit 517 is configured to store only the identification information of the light emitting module 510, the database 660 may store the absolute lifetime information of the light emitting module 510 corresponding to the identification information of the light emitting module 510. In this configuration, the information management unit 620 or the lifetime information calculation unit 630 can check the absolute lifetime information of the light emitting module 510 through the database 660. The database 660 may be updated periodically and the characteristic information of the new light emitting module 510 can be additionally provided.

Moreover, the replacement information and the residual lifetime information of each light emitting module 510 calculated based on the absolute lifetime information may be also stored in the database 660.

Meanwhile, in accordance with another exemplary embodiment of the present invention, it may be possible to manage characteristic information on the unit of light emitting package 511 included in each light emitting module 510.

In such a case, absolute lifetime information of each light emitting package 511 may be checked based on identification information of the light emitting package 511 and residual lifetime information of the light emitting package 511 may be calculated based on the absolute lifetime information, in the same manner as described above. It may be also possible to generate replacement information based on the calculated residual lifetime information, thus allowing the manager to perform replacement on the unit of the light emitting package 511 included in the light emitting module 510.

Figure 9:
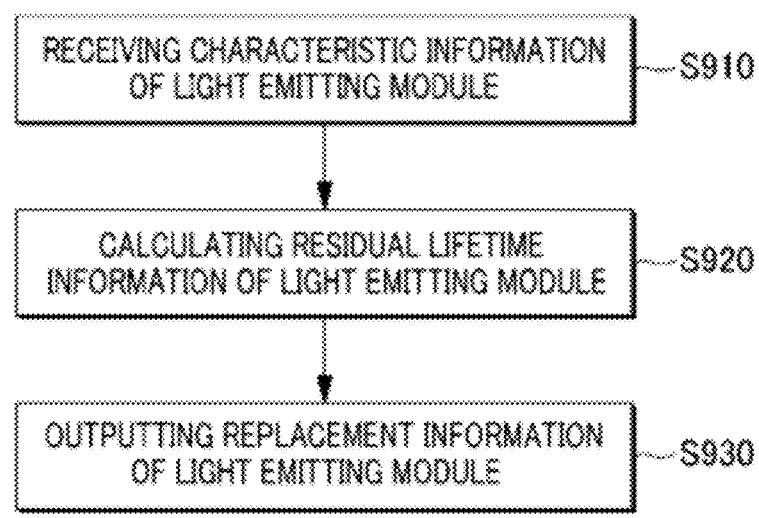
FIG. 9 is a flowchart describing a management method for the illumination system according to an exemplary embodiment of the present invention.

FIG. 9 is a flowchart describing a management method for the illumination system 10 in accordance with an exemplary embodiment of the present invention.

First, the management apparatus 600 of the illumination system 10 may receive characteristic information of the light emitting module 510 connected to the light emitting apparatus 500 (S910). At this time, the characteristic information may include absolute lifetime information or unique identification information of the light emitting module 510. When the unique identification information is received, the absolute lifetime information matched thereto in the database 660 may be retrieved, so that the absolute lifetime information of the light emitting module 510 can be checked.

Thereafter, residual lifetime information is calculated based on the absolute lifetime information of the light emitting module 510 (S920). For example, a residual lifetime of the light emitting module 510 may be calculated by comparing the absolute lifetime information with time that has passed after the light emitting module 510 is connected to the light emitting apparatus 500.

Subsequently, replacement information of the light emitting module 510 is outputted based on the residual lifetime information (S930).

A light emitting module 510 of which residual lifetime is within a threshold value is detected, and replacement information for the corresponding light emitting module 510 is outputted through the user interface or the like. At this time, not only the residual lifetime information of the light emitting module 510 as a target of replacement but also residual lifetime information of the remainder of light emitting modules 510', etc., may be outputted, thus helping the manager of the system make a decision upon whether or not to replace each light emitting module 510, 510', etc.

In addition, information upon a light emitting apparatus 500, 500', 500'', etc., to which the light emitting module 510, 510', etc., as the target of replacement is connected and position information or socket information of the corresponding light emitting apparatus 500, 500', 500'', etc., may be also displayed, thus facilitating replacement of the corresponding light emitting module 510, 510', etc.

If the replacement of the light emitting module 510 is completed according to the replacement information, whether the light emitting module has been replaced may be known by detecting disconnection of the light emitting module and connection of a new light emitting module 510 consecutively. Then, driving information of the new light emitting module 510 may be recorded.

Figure 10:
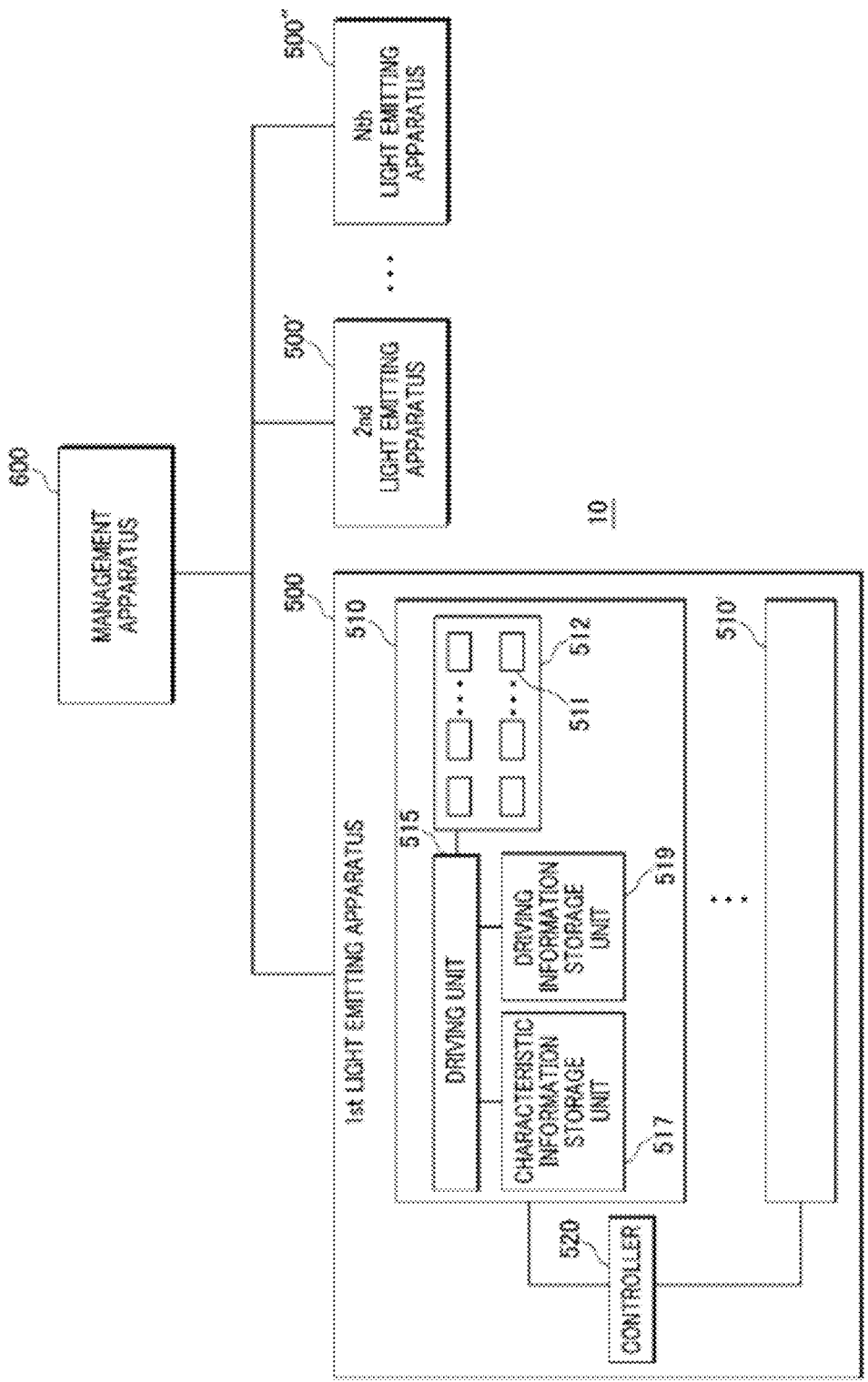
FIG. 10 is a diagram showing an illumination system according to an exemplary embodiment of the present invention.

FIG. 10 is a diagram showing an illumination system according to an exemplary embodiment of the present invention.

Each light emitting module 510 of an illumination system 10 in accordance with the present exemplary embodiment may further include a driving information storage unit 519 for storing driving information of the light emitting module 510.

The driving information storage unit 519 may store driving control information of the light emitting module 510 controlled by a driving unit 515. For example, the driving information storage unit 519 may store information upon a driving time, a driving start time point, a driving stop time point, and a driving dimming level of the light emitting module 510.

Further, the driving information storage unit 519 may further store information upon a time point for connecting the light emitting module 510 to the light emitting apparatus 500 and information upon a time point for disconnecting the light emitting module 510 from the light emitting apparatus 500. Such information stored in the driving information storage unit 519 may be read out and transmitted to a management unit 600 in response to a request from a manager of the management apparatus 600. The driving information storage unit 519 may be implemented by a nonvolatile memory device such as a flash memory. Moreover, the driving information storage unit 519 and a characteristic information storage unit 517 may be implemented by different memory areas in a single memory device.

An interface unit 526 of a controller 520 may read out the driving information of the light emitting module 510 from the driving information storage unit 519 and send the read-out driving information to the management apparatus 600. Further, a connector 540 may transmit the driving information of each light emitting module 510 read out through the interface unit 526 to the management apparatus 600.

The management apparatus 600, which is substantially similar to the management apparatus 600 described above with respect to FIG. 8, may calculate residual lifetime information by considering the received driving information. The driving information may be managed through a reception unit 610, information management unit 620, and the like.

A lifetime information calculation unit 630 may calculate a residual lifetime of the light emitting module 510 based on the characteristic information and the driving information of the light emitting module 510. Then, the lifetime information calculation unit 630 may store the calculated residual lifetime information in a database 660. For example, in the state that the absolute lifetime information of each light emitting module 510 and the information upon the driving start time point thereof are recorded, the lifetime information calculation unit 630 can calculate the residual lifetime of the light emitting module 510 by comparing the absolute lifetime information with the time that has elapsed after the driving start time point.

Moreover, an overall driving time may be calculated by accumulating an actual driving time of the light emitting module 510, and the residual lifetime may be calculated by subtracting the calculated overall driving time from the absolute lifetime information.

Furthermore, it may be also possible to calculate an overall driving time by applying a weight to the actual driving time of the light emitting module 510 based on a voltage level applied to adjust a dimming level of the light emitting module 510. For example, if a voltage equal to or higher than a reference voltage level is applied, the actual driving time is multiplied by a weight equal to or larger than about 1, whereas if a voltage lower than the reference voltage level is applied, the actual driving time may be multiplied by a weight smaller than about 1. Then, the driving times to which the weights are applied are added up, so that the overall driving time is calculated. Thereafter, the residual lifetime can be calculated by subtracting the calculated overall driving time from the absolute lifetime information.

The database 660 may store information upon a driving start time point for each light emitting module 510, thus making it possible to calculate time information that has passed after the driving of each light emitting module 510 is started. Moreover, the database 660 may also store driving information of each light emitting module 510 in a cumulative manner, so that the information upon the actual driving time of each light emitting module 510 can be accumulated. Since the driving conditions for each light emitting module 510 may differ, overall driving time information may be accumulated for each light emitting module. In addition, more accurate driving information of each light emitting module 510 may be stored by additionally storing the dimming level information of each light emitting module 510. Further, the replacement information and the residual lifetime information of each light emitting module 510 calculated based on the absolute lifetime information and the driving information of each light emitting module 510 may also be matched and stored in the database 660.

Figure 11:
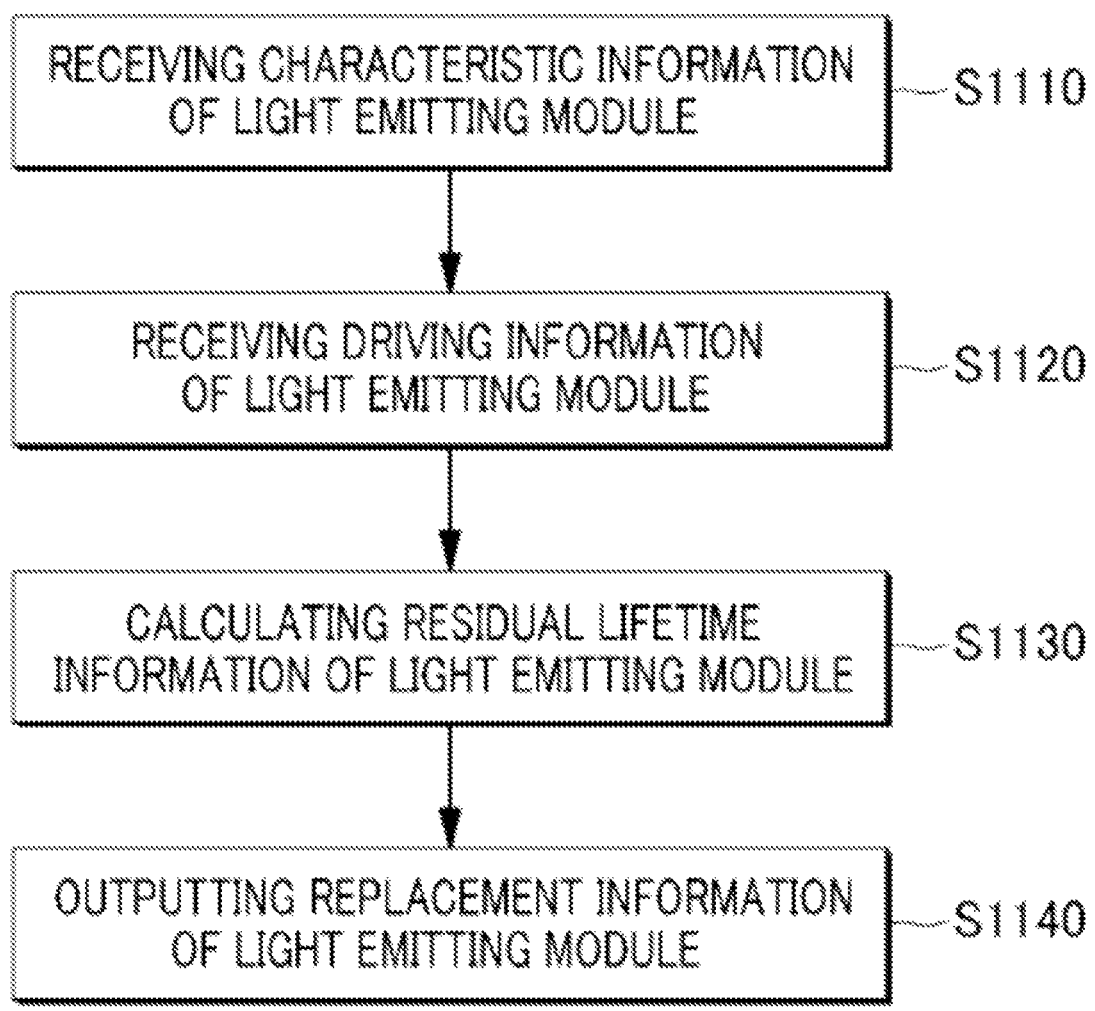
FIG. 11 is a diagram describing a management method for the illumination system according to an exemplary embodiment of the preset invention.

FIG. 11 is a diagram describing a management method for the illumination system 10 according to an exemplary embodiment of the present invention.

The management method according to the present exemplary embodiment may be substantially similar to the method described with respect to FIG. 9 above. However, the present exemplary embodiment may further include an additional step S1120 for receiving driving information. Accordingly, a step S1130 for calculating the lifetime information may be modified.

Driving information of the light emitting module 510 is received (S1120). The driving information may include information upon a time point of connection of the light emitting module 510 to the light emitting apparatus 500, driving time information of the light emitting module 510, a dimming level information of the light emitting module 510, or the like.

Next, residual lifetime information is calculated based on absolute lifetime information and driving information of the light emitting module 510 (S1130). For example, a residual lifetime of the light emitting module 510 may be calculated by subtracting driving time information from the absolute lifetime information thereof. Alternatively, the residual lifetime may be calculated by subtracting, from the absolute lifetime information, a value obtained by applying to the driving time information of the light emitting module 510 a weight according to a dimming level thereof.

As discussed above, by calculating the residual lifetime by additionally considering the driving information of the light emitting module 510, it may be possible to calculate the residual lifetime information almost coincident with an actual driving state of the light emitting module.

Figure 12:
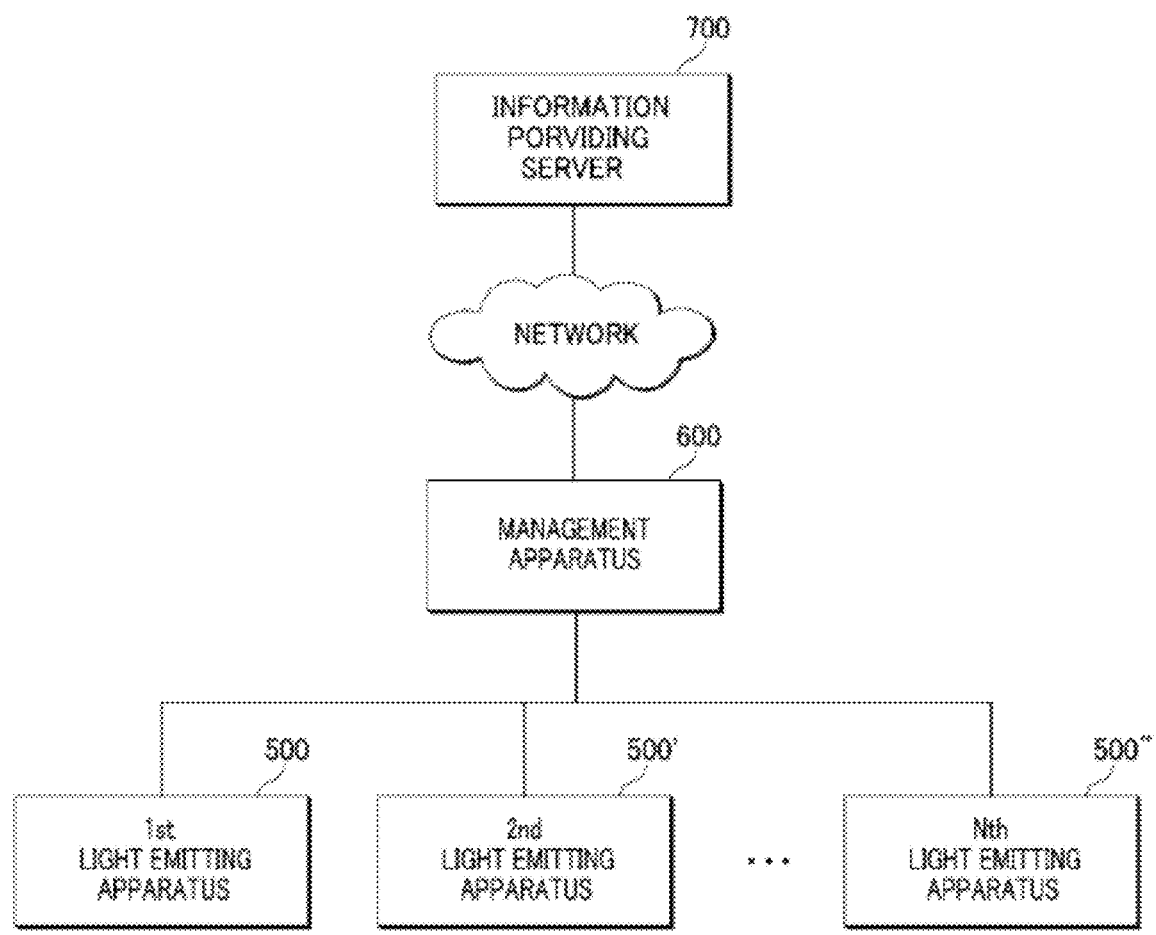
FIG. 12 is a diagram showing an illumination system according to an exemplary embodiment of the present invention.

FIG. 12 is a diagram showing an illumination system 10 according to an exemplary embodiment of the present invention.

In accordance with the present exemplary embodiment, a management apparatus 600 of an illumination system 10 may access an information providing server 700 through a network and request characteristic information of each light emitting module 510 in a light emitting apparatus 500, 500', or 500".

At this time, the network may be implemented by a wireless network such as a local area network (LAN), a wide area network (WAN), or a value added network (VAN), or a wireless network such as a mobile radio communication network or a satellite communication network.

The management apparatus 600 of the illumination system 10 may acquire unique identification information of the light emitting module 510 and can also acquire from a database 660 a URL of a manufacturer of the light emitting module 510 matched with the unique identification information. Furthermore, the management apparatus 600 can also access the information providing server 700 corresponding to the acquired URL and can receive characteristic information corresponding to the unique identification information of the light emitting module 510.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An illumination system, comprising:
   at least one light emitting apparatus comprising:
   at least one light emitting module detachably coupled to the at least one light emitting apparatus, the at least one light emitting module comprising an information storage unit to store characteristic information of the at least one light emitting module; and
   a controller configured to detect whether the at least one light emitting module is connected to or disconnected from the at least one light emitting apparatus, and to read out the characteristic information of the at least one light emitting module according to a detection result,
   wherein the characteristic information comprises unique identification information or absolute lifetime information of the at least one light emitting module.

2. The illumination system of claim 1, further comprising a management apparatus connected to the at least one light emitting apparatus, the management apparatus configured to calculate, when the at least one light emitting module is connected to the at least one light emitting apparatus, residual lifetime information of the at least one light emitting module based on the characteristic information stored in the information storage unit.

3. The illumination system of claim 2, wherein the management apparatus is configured to calculate the residual lifetime information based on the absolute lifetime information in the characteristic information or absolute lifetime information of the at least one light emitting module acquired based on the unique identification information.

4. The illumination system of claim 3, wherein the management apparatus is configured to acquire the absolute lifetime information matched with the unique identification information from a database stored in the management apparatus.

5. The illumination system of claim 2, wherein the controller comprises:
   a detection signal processing unit configured to generate a connection detection signal or a disconnection detection signal based on sensing information received from a sensor connected with the at least one light emitting apparatus; and
   an interface unit configured to read out the characteristic information from the information storage unit in response to the connection detection signal and to send the characteristic information to the management apparatus.

6. The illumination system of claim 5, wherein the detection signal processing unit is configured to detect a variation of a pressure applied to the at least one light emitting apparatus when the at least one light emitting module is connected to or disconnected from the at least one light emitting apparatus, and to generate the connection detection signal or the disconnection detection signal based on the variation of the pressure.

7. The illumination system of claim 5, wherein the detection signal processing unit is configured to detect a variation of an electric signal in the vicinity of an electrical connection area between the at least one light emitting module and the at least one light emitting apparatus when the at least one light emitting module is connected to or disconnected from the at least one light emitting apparatus, and to generate the connection detection signal or the disconnection detection signal based on the variation of the electric signal.

8. The illumination system of claim 2, wherein the management apparatus comprises:
an information management unit configured to manage at least one of the unique identification information and the absolute lifetime information of the at least one light emitting module based on the characteristic information of the at least one light emitting module; and
a lifetime information calculation unit configured to calculate a residual lifetime of the at least one light emitting module based on the absolute lifetime information of the at least one light emitting module and to store the residual lifetime in a database,
wherein the lifetime information calculation unit is configured to calculate the residual lifetime by subtracting, from the absolute lifetime information of the at least one light emitting module, a time that has passed after the at least one light emitting module is connected to the at least one light emitting apparatus.

9. The illumination system of claim 2, wherein the management apparatus is configured to detect a light emitting module of which the residual lifetime is within a threshold value based on the residual lifetime information, to generate replacement information for the light emitting module of which residual lifetime is within the threshold value, and to output the replacement information.

10. The illumination system of claim 9, wherein the management apparatus is configured to display the residual lifetime information of the light emitting module or information indicating that the light emitting module, of which residual lifetime is within a threshold value, is a replacement target.

11. The illumination system of claim 10, wherein the management apparatus is configured to display position information of the replacement target light emitting module.

12. The illumination system of claim 2, wherein the at least one light emitting module further comprises a driving information storage unit configured to store driving information of the at least one light emitting module,
wherein the controller is configured to send the driving information in response to a request from the management apparatus,
wherein the management apparatus is configured to calculate the residual lifetime information of the at least one light emitting module based on the characteristic information and the driving information, and
wherein the driving information comprises at least one of a driving time of the at least one light emitting module, a driving start time point of the at least one light emitting module, a driving stop time point of the at least one light emitting module, and a dimming level of the at least one light emitting module.

13. The illumination system of claim 12, wherein the management apparatus comprises:
an information management unit configured to manage at least one of the unique identification information and the absolute lifetime information of the at least one light emitting module based on the characteristic information of the at least one light emitting module, and to manage the driving information of the at least one light emitting module using a database; and
a lifetime information calculation unit configured to calculate a residual lifetime of the at least one light emitting module based on the absolute lifetime information of the at least one light emitting module and the driving information of the at least one light emitting module, and to store the residual lifetime in the database.

14. The illumination system of claim 13, wherein the lifetime information calculation unit is configured to calculate the residual lifetime by subtracting a driving time of the at least one light emitting module from the absolute lifetime information of the at least one light emitting module.

15. The illumination system of claim 13, wherein the lifetime information calculation unit is configured to calculate the residual lifetime by subtracting, from the absolute lifetime information of the at least one light emitting module, a value obtained by applying a weight according to a dimming level of the at least one light emitting module to a driving time thereof.

16. The illumination system of claim 2, wherein the management apparatus is configured to acquire the absolute lifetime information of the at least one light emitting module by accessing a lifetime information providing server according to information matched with the unique identification information of the at least one light emitting module.

17. The illumination system of claim 12, wherein the management apparatus is configured to acquire the absolute lifetime information of the at least one light emitting module by accessing a server according to information matched with the unique identification information of the at least one light emitting module.

18. The illumination system of claim 2, wherein the at least one light emitting module further comprises at least one light emitting package detachably coupled to the at least one light emitting module,
wherein the at least one light emitting package comprises an information storage unit configured to store characteristic information of the light emitting package, and
wherein the controller is configured to detect whether the at least one light emitting package is connected to or disconnected from the light emitting module, to read out the characteristic information of the at least one light emitting package from the information storage unit, and to send the characteristic information of the at least one light emitting package to the management apparatus,
wherein the characteristic information comprises unique identification information or absolute lifetime information of the at least one light emitting package.

19. An illumination system, comprising:
a light emitting apparatus comprising:
a light emitting module detachably coupled to the light emitting apparatus, the light emitting module comprising an information storage unit to store characteristic information of the light emitting module; and
a controller configured to read out the characteristic information of the light emitting module,
wherein the characteristic information comprises unique identification information or absolute lifetime information of the light emitting module.

* * * * *